United States Patent [19]
Koo et al.

[11] Patent Number: 5,386,423
[45] Date of Patent: Jan. 31, 1995

[54] ORDERING SHIFT REGISTER LATCHES IN A SCAN RING TO FACILITATE DIAGNOSIS, TESTING AND ISOLATION

[75] Inventors: Catherine C. Koo; Benedicto U. Messina, both of Poughkeepsie, N.Y.; Jerry Saia, Knoxville, Tenn.

[73] Assignee: International Business Machines Corporation, Armonk, N.Y.

[21] Appl. No.: 75,986

[22] Filed: Jun. 11, 1993

Related U.S. Application Data

[63] Continuation of Ser. No. 685,108, Apr. 15, 1991, abandoned.

[51] Int. Cl.⁶ .............................................. H04B 17/00
[52] U.S. Cl. ................................................... 371/22.3
[58] Field of Search .......................... 371/22.3, 3, 22.6

[56] References Cited

U.S. PATENT DOCUMENTS

| | | | |
|---|---|---|---|
| 4,441,075 | 4/1984 | McMahon | 371/22.3 |
| 4,534,028 | 8/1985 | Trischler | 371/22.3 |
| 4,743,840 | 5/1988 | Sato | 371/3 |
| 4,764,926 | 8/1988 | Knight | 371/22.3 X |
| 4,819,166 | 4/1989 | Si et al. | 364/200 |
| 4,827,476 | 5/1989 | Garcia | 371/25 |
| 4,872,169 | 10/1989 | Whetsel | 371/22.3 |
| 5,043,986 | 8/1991 | Agrawal | 371/22.6 |
| 5,172,377 | 12/1992 | Robinson | 371/22.3 |

FOREIGN PATENT DOCUMENTS 0392636 10/1990 European Pat. Off.
2218816 5/1986 United Kingdom ............... 371/22.3

OTHER PUBLICATIONS

Stolte et al., Design For Testability of the IBM System/38, 1979, pp. 255-262 (from IEEE 1979 Test Conference).

Goel et al., Functional Tests For Purposes of Shift Register Testing, Jun. 1978, pp. 157-158 (from IBM Technical Bulletin, vol. 21 No. 1).

ASIC Technology, Oct. 1990 by P. P. Fasang "Boundary Scan Addresses Parametric Test Issues".

IEEE Transaction on Computers, J. Savir, vol. C-35 No. 1, Jan. 1986 "The Bidirectional Double Latch (BDDL)".

EDN, Apr. 1989 "Support for Scannable Design Grows in Board and ASIC Test".

Primary Examiner—Robert W. Beausoliel, Jr.
Assistant Examiner—Glenn Snyder
Attorney, Agent, or Firm—Lawrence D. Cutter

[57] ABSTRACT

In a shift register latch scan string such as that employed in level sensitive scan design (LSSD) methodologies, primary input and/or primary output signal line connections are distributed in a substantially uniform fashion along the length of the shift register scan string configuration so as to provide a mechanism for testing for fault conditions existing along the scan string.

7 Claims, 6 Drawing Sheets

ORDERING SHIFT REGISTER LATCHES IN A SCAN RING TO FACILITATE DIAGNOSIS, TESTING AND ISOLATION

This is a continuation of copending application Ser. No. 07/685,108 filed on Apr. 15, 1991.

BACKGROUND OF THE INVENTION

The present invention is generally directed to the design of shift register latch scan strings used in the level sensitive scan design approach to logic circuit design. More particularly, the present invention is directed to a logic circuit and test method which is able to provide tests of shift register latch scan strings. In a sense, the present invention permits "testing of the tester".

In order to fully appreciate the operation and advantages of the present invention, it is necessary to consider the level sensitive scan design (LSSD) methodology of logic circuit design. In this design methodology, blocks of combinatorial logic circuitry include input signal lines which are supplied from shift register latches and in turn supply output signal lines to shift register latches. These shift register latches are arranged in scan strings and function in two roles. In normal operation, the shift register latches receive input signals and act as temporary storage for output signals from a first combinatorial logic block to a second, third or subsequent combinatorial logic circuit block. In a test mode of operation, the shift register latches are electrically configured into a single shift register latch scan string which is capable of receiving a string of input signals. By shifting predetermined signal values into the scan string, one may control the signals which are supplied to the combinatorial logic blocks. Likewise, on the output side of the combinatorial logic blocks, output signals may be stored and shifted out for analysis, especially analysis relating to error conditions. In this fashion, each logic block may be tested independently of the function of other blocks.

Since circuits have become much more complex, this aspect of testing has become more important, if not critical in the design and production of very large scale integrated circuit devices. In particular, because of the great complexity of these devices which often contain hundreds of thousands of individual circuit elements, errors in design, implementation or manufacture may occur. Accordingly, it therefore becomes very important to test these logic circuits prior to their being shipped, either by themselves or in a more complicated end product.

The level sensitive scan design methodology has been very successful since it has reduced the test pattern generation task tremendously. This design methodology has allowed testers to scan in a pattern to the shift register latch scan string and scan out resultant data from the scan string. Examples of LSSD rules are found for example in U.S. Pat. No. 4,476,431, issued Oct. 19, 1984 to Arnold Blum; in U.S. Pat. No. 4,513,418, issued Apr. 23, 1985 to Paul H. Bardell and William H. McAnney; and in U.S. Patent No. 4,293,919, issued Oct. 6, 1981 to Sumit DasGupta, et al.; in U.S. Pat. No. 4,687,988, issued Aug. 18, 1987 to Edward B. Eichelberger et al.; and in U.S. Pat. No. 4,503,539, issued Mar. 5, 1985 to William H. McAnney.

The LSSD methodology, as indicated above, has proven to be a fruitful solution to many of the problems of design, fault isolation and test in very large scale integrated circuits. However, if a faulty shift register latch occurs in the scan string, there is no easy way to diagnose and locate the faulty latch. However, because these latches and shift strings play such an important role in the testing of VLSI devices and systems, it is desirable that some mechanism be provided for assuring their proper operation. In particular, the present invention fulfills this role.

In order to more fully grasp the advantages of the present invention, three different time frames are considered. The first time frame occurs after the chip or system has been manufactured or assembled. The second time frame occurs when the chip or system is being employed in normal operation and a test modality is entered, caused for example by the occurrence of an error condition someplace in the machine or circuit. The third time frame occurs when specific tests are being performed on a failed chip or system as a result of the desire to perform physical failure analysis so as to isolate the failed micronet on the malfunctioning chip. In this way, information can be gleaned about the manufacturing or design process. For example, it is easily seen that it is desirable to be able to determine whether the failure is caused by a microscopic piece of dust or by a design error. Product improvement depends on such error analysis. Accordingly, the present invention provides a mechanism to localize the fault to a small group of shift register latches and sometimes to a single faulty SRL by using design considerations described herein.

SUMMARY OF THE INVENTION

In a preferred embodiment of the present invention a logic circuit which has a testable scan string comprises at least two combinatorial logic circuit blocks one of them having a set of primary input signal lines and the other having a set of primary output signal lines. Additionally, there is provided a set of shift register latches which are configurable to operate either as a single shift register or as individual latches for receiving primary input signals, primary output signals or as intermediate latches between combinatorial logic blocks. Most importantly for the invention herein, either the set of primary input signal lines are uniformly distributed along the shift register string or the primary output signal lines are similarly distributed. In fact, both the primary input and primary output signal lines may each be distributed in a substantially uniform fashion along the shift register scan string. The use of this design allows one to localize faulty shift register latches to smaller groups and sometimes to a single faulty SRL.

Accordingly, it is an object of the present invention to be able to test shift register latches occurring in LSSD scan strings.

It is also an object of the present invention to facilitate physical failure analysis.

It is yet another object of the present invention to determine beforehand the proper functioning of test circuitry used in VLSI design.

It is a still further object of the present invention to facilitate the diagnosing, testing and isolation of faulty latches in shift register scan strings, particularly those employed in LSSD methodologies.

It is also an object of the present invention to extend and promote LSSD methodology.

Lastly, but not limited hereto, it is an object of the present invention to ensure the production and operation of more reliable and more easily testable integrated circuit devices, particularly those employed in digital computers and other information handling systems.

DESCRIPTION OF THE FIGURES

The subject matter which is regarded as the invention is particularly pointed out and distinctly claimed in the concluding portion of the specification. The invention, however, both as to organization and method of practice, together with the further objects and advantages thereof, may best be understood by reference to the following description taken in connection with the accompanying drawings in which:

DETAILED DESCRIPTION OF THE INVENTION

Figure 1:
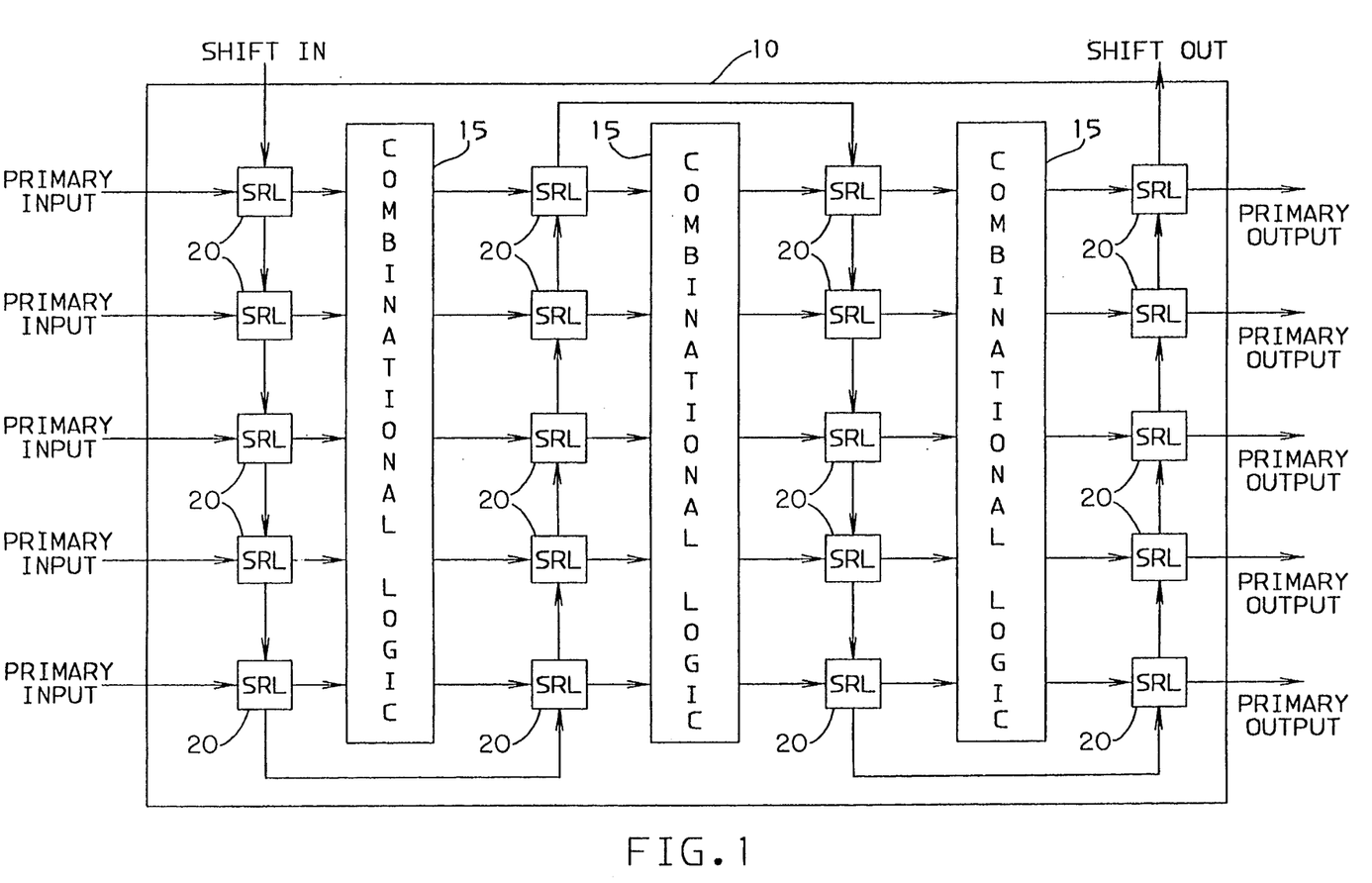
FIG. 1 is a functional block diagram illustrating LSSD methodology and its employment of reconfigurable shift register latches in a single scan string.

FIG. 1 illustrates the environment in which the problem solved by the present invention arises. In particular, it is seen that a digital logic chip or system 10 includes a plurality of combinational logic blocks 15. In general, combinational logic blocks 15 represent any digital logic circuit and can in fact include embedded sequential logic circuits as opposed to circuits which are purely combinatorial in nature. As indicated above, because of the problems of large scale circuit design, implementation and manufacture, it is very desirable to divide a logic system into a plurality of subsystems as indicated by separate logic blocks 15. The testing of such blocks becomes accordingly much more tractable and efficient. Note however that here the use of the common reference numeral 15 does not imply that each of the logic blocks are identical, only that such blocks are being referred to generically.

One of the mechanisms for providing test capability employs a shift register scan string comprising individual shift register latches 20. A typical level sensitive scan design circuit is shown in FIG. 1 illustrating the relationship between combinational logic blocks 15 and the scan string of shift register latches 20. In particular, by selecting appropriate timing and input signals such as are described in the aforementioned patents, shift register latches 20 are configurable to operate either in the form of a single, long shift register or to function as intermediate data storage buffers between combinational logic blocks 15. Additionally, certain shift register latches are also operable to receive primary input signals and to temporarily store primary output signals. Thus the shift register latches in the scan string are also capable of effectively operating as chip or system input and output buffers or latches. (As used herein and in the appended claims, the term "primary input" refers to physical pins or terminals through which the outside world supplies information to the chip or system, as opposed to primary outputs which are correspondingly defined as pins or terminals through which the chip or system supplies information to the outside world.) Primary input and primary output signal lines are accordingly illustrated in FIG. 1. It should also be appreciated that shift register latches 20 typically involve a dual latch design such as that shown in the article titled "Logic Delay Characterization of a LSSD Logic Circuit Using a Scan Ring", IBM Technical Disclosure Bulletin, Vol. 27, No. 11, April 1985 by T.J. Beacom and D.J. Thomforde.

During normal operation of chip or system of chips 10, the primary input lines supply signals directly to the first five shift register latches shown on the left in FIG. 1. These signals are supplied to the leftmost combinational logic block 15 whose output signals are supplied directly to the second set of five shift register latches shown in FIG. 1. In turn, the signals from these latches are supplied to the middle one of the three combinational logic blocks shown. In this mode the shift register latches are not operating as part of a shift register but rather are operating in a parallel fashion so as to accept primary input signals and to pass output signals from one combinational logic block stage to the next. Ultimately, the output signals from the rightmost combinational logic block 15 are supplied to the rightmost set of five shift register latches shown. These latter latches directly supply the primary output signal lines.

It should be appreciated though that FIG. 1 is merely illustrative. In typical situations there may be as many as a thousand shift register latches in a scan string and correspondingly there are also many more separate combinational logic blocks employed.

It should also be noted that FIG. 1 is merely illustrative in the sense that it would not normally be expected that each SRL supplying a signal to the first (here leftmost) combinational logic block would receive an input from a primary input signal line. In a similar fashion, it should be noted that it would not normally be expected that each SRL receiving a signal from the last (here rightmost) combinational logic block would provide a signal to a primary out line. One other variation that may be present but which is not specifically illustrated in FIG. 1, is the fact that an SRL output signal line that is shown supplying a signal to a combinational logic block to its right, might instead be used to supply a signal to a combinational logic block to its left through a SRL occurring earlier in the string.

It is thus seen that the SRLs of FIG. 1, and also those of FIGS. 2 and 3, can be divided into three groups: INPUT SRLs, OUTPUT SRLs and INTERNAL SRLs. INPUT SRLs are those whose output signal lines depend on primary input signal values. An OUTPUT SRL is one whose output signal line directly feeds a primary output signal line (or chip output driver). An INTERNAL SRL is one whose output signal is dependent on other SRL outputs and other primary input signal lines.

During test operations, normal system clocks are used to capture test responses in the shift register latches. Also in this mode of operation, desired test signals are supplied from the "SHIFT IN" line and desired test responses are ultimately supplied on the "SHIFT OUT" line. During test operations, shift register latches 20 are configured in a long shift register configuration, in accordance with LSSD methodology. It is thus seen how shift register latches 20 function to isolate combinational logic blocks and to supply and retrieve test data and test output. However, if there is a problem with any of the shift register latches in the chain, the test function is impaired as is also the potential functioning of the chip or system 10 by virtue of the fact that signal communication between combinational logic blocks is impaired. Accordingly, as pointed out above, it is desirable to be able to provide a mechanism for testing the operation of the shift register latches in the scan string.

Figure 2A:
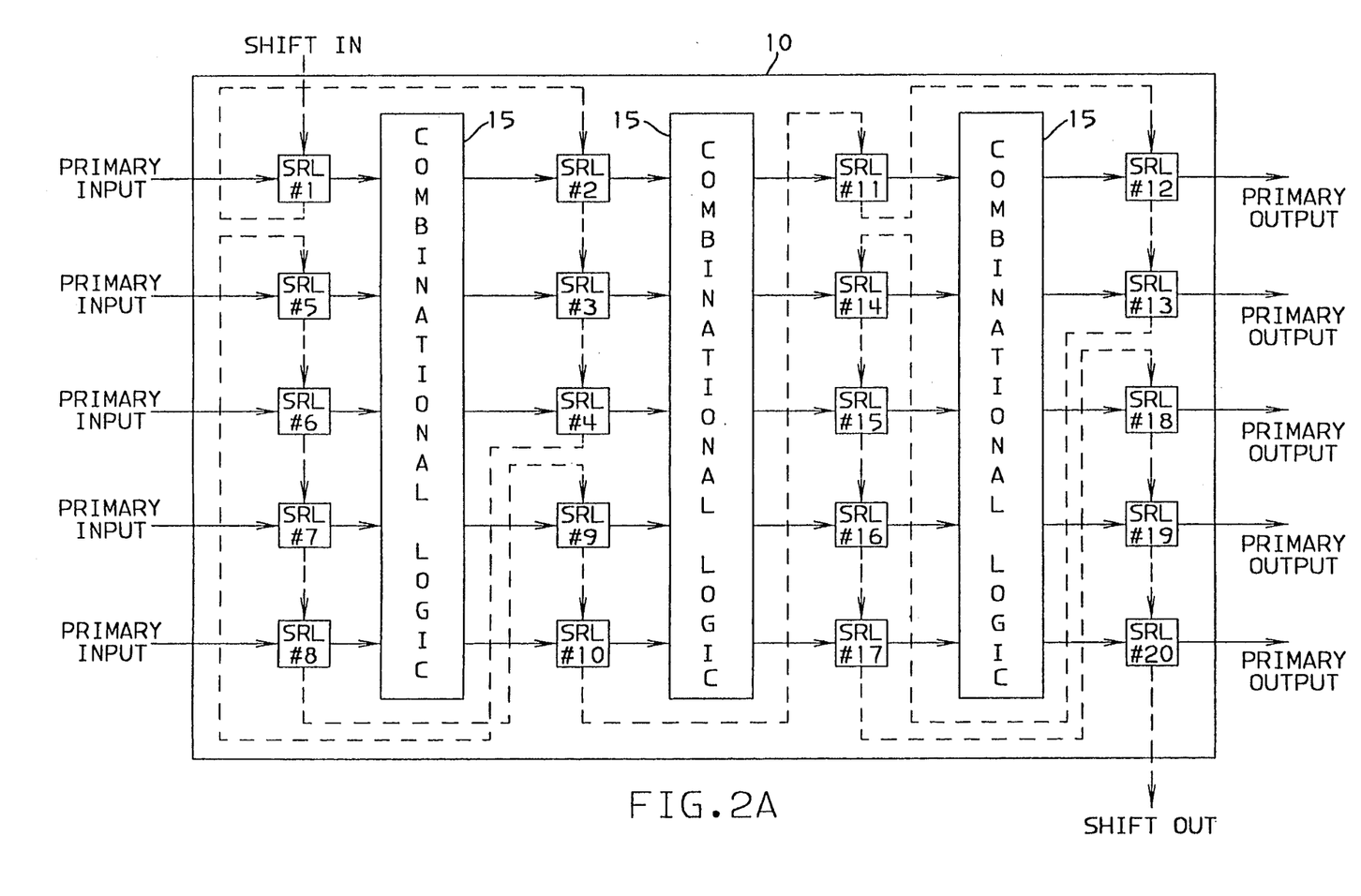
FIG. 2A is a functional block diagram similar to FIG. 1 but more particularly illustrating an ordering arrangement of shift register latches in accordance with the present invention.
Figure 2B:
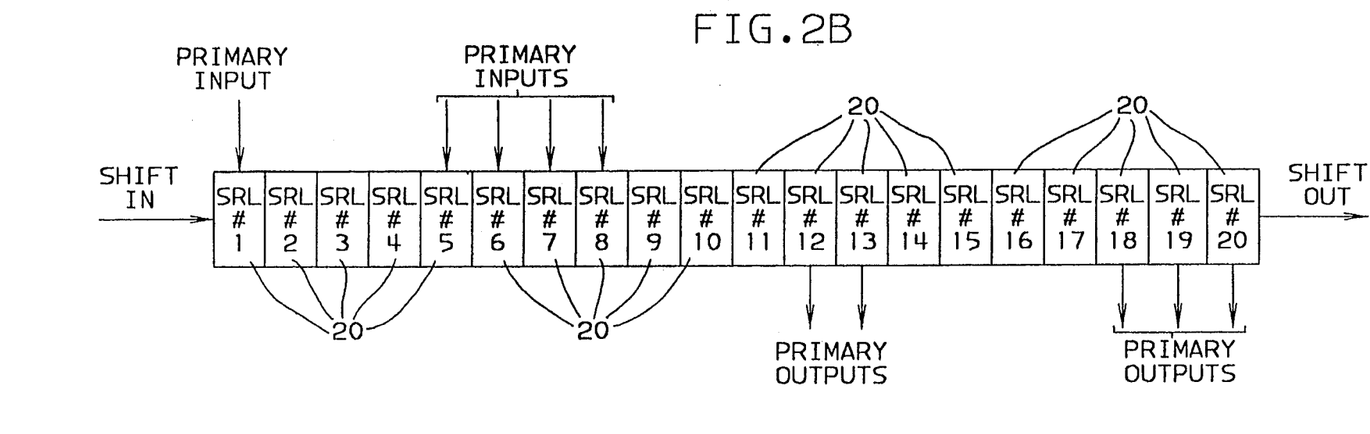
FIG. 2B illustrates the distribution of primary input and primary output signal lines along the shift register scan string shown in FIG. 2A in a more linear fashion to emphasize the distribution aspects of the present invention.

Such a solution is illustrated in FIG. 2A. FIG. 2A is substantially the same as FIG. 1 except that the shift register latches in the scan string are now ordered differently. This does not affect in any way the operation of the shift register latches as signal communication means between logic blocks but rather only affects the test function. Most importantly, the reordering of the shift register latches provides a mechanism for shift register latch operation verification. In particular, attention is directed to the sequence numbers provided in each shift register latch 20 in FIG. 2A. To more clearly illustrate the modified ordering of shift register latches, the corresponding signal lines are shown in a dotted fashion. While the appearance of the connections between shift register latches in FIG. 2A suggests a somewhat random ordering, a much better understanding of applicants' invention may be gleaned from FIG. 2B in which the shift register scan string is redrawn in isolation with emphasis on the sequential ordering of the latches with respect to primary inputs and outputs as opposed to their specific relationship to individual combinational logic blocks 15. Most importantly, it is seen that the distribution of primary input and primary output connections along the scan string is much more uniform. These connections are no longer lumped together at either the beginning or the end of the scan string. Furthermore, there is a clear suggestion from FIG. 2A that this new distribution only serves to complicate circuit layout. However, the perspective provided by FIG. 2B is sufficient to illustrate the circuit from the viewpoint of redistributing primary input and output signal lines.

Figure 3A:
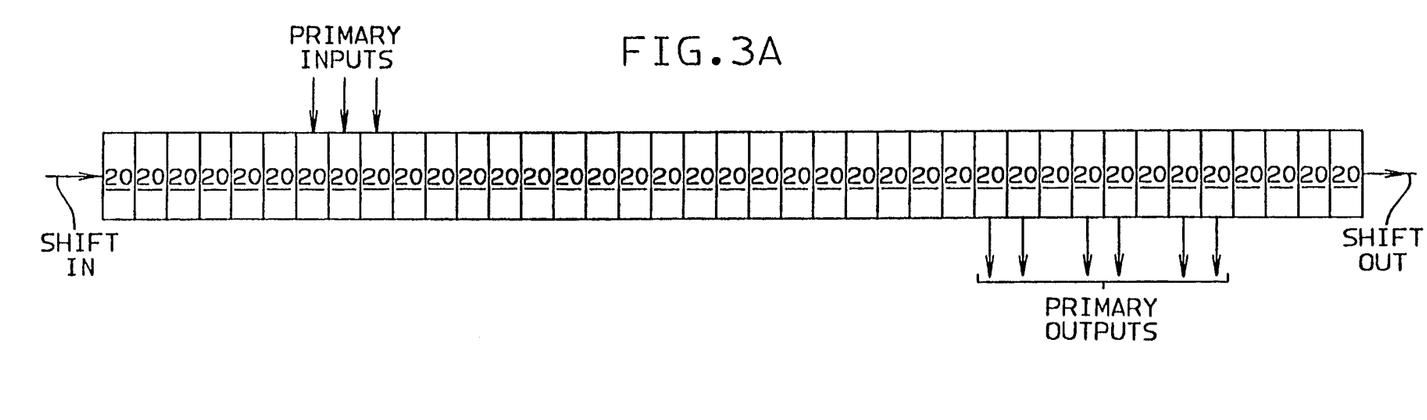
FIG. 3A is a functional block diagram of a scan string illustrated in isolation from the rest of the combinatorial logic blocks, so as to more particularly show the usual distribution of primary input and output signal lines and to more particularly illustrate the kind of distribution shown in FIG. 1.

This new arrangement should therefore be contrasted with the old form of circuit input and output connection arrangement shown in FIG. 3A, where the signal connections are lumped together at the beginning and end regions of the scan string. These arrangements make it very difficult to test and to isolate individual faulty shift register latches in the scan string. The scan string arrangement illustrated in FIG. 2B and those like it can however provide a mechanism for isolating faulty shift register latches. In particular, the method of isolation is based upon the binary search concept and is more particularly described below, with respect to FIGS. 4A and 4B.

Figure 3B:
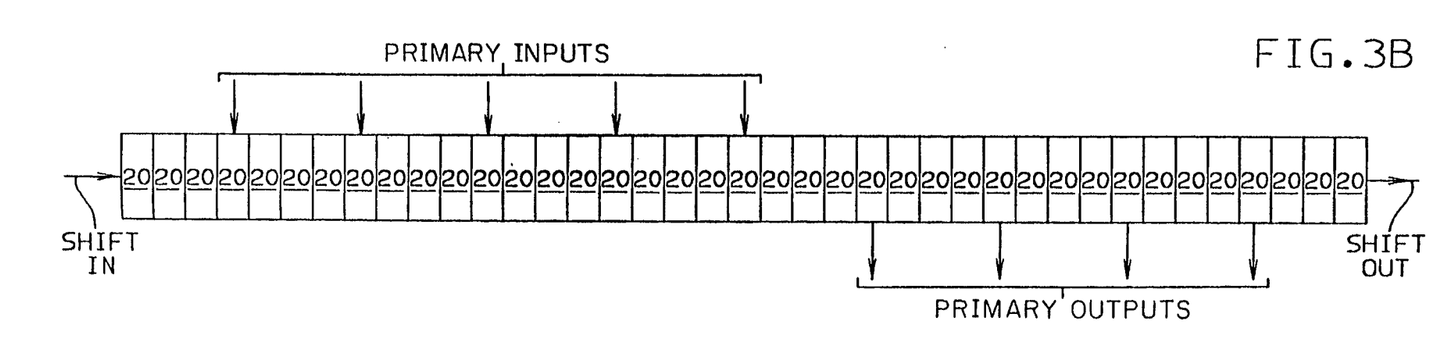
FIG. 3B is a functional block diagram similar to FIG. 3A but more particularly showing a distribution of primary input and primary output signal lines in accordance with one embodiment of the present invention.
Figure 3C:
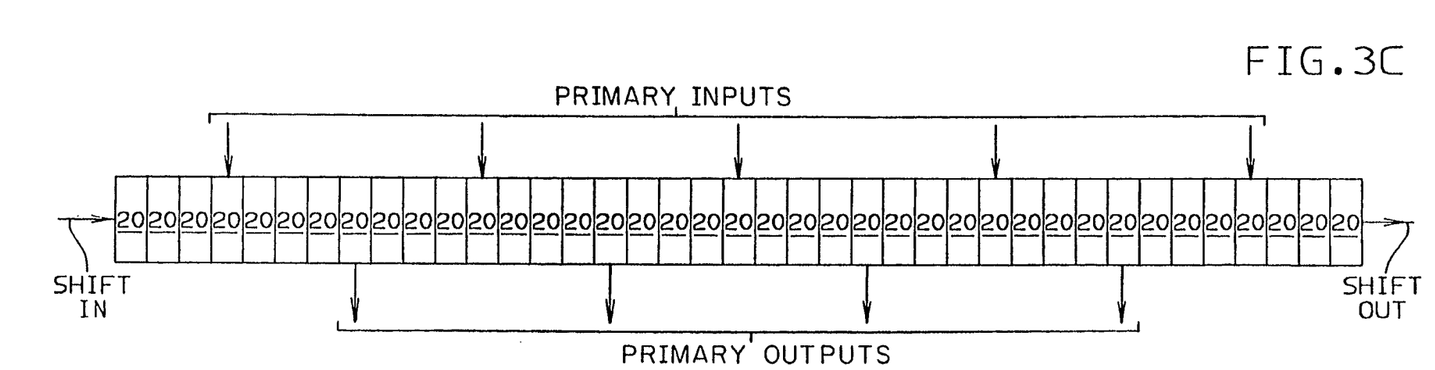
FIG. 3C is a functional block diagram similar to FIG. 3B illustrating an alternate embodiment of the present invention.

The lumped distribution of primary input and output signal lines as shown in FIG. 3A should therefore be contrasted with the more evenly distributed arrangement shown in FIG. 3B. However, an even more distributed arrangement is shown in FIG. 3C. The arrangement in FIG. 3C provides for even greater flexibility in the selection of test signals and in the determination of faulty latches in the scan path.

Figure 3D:
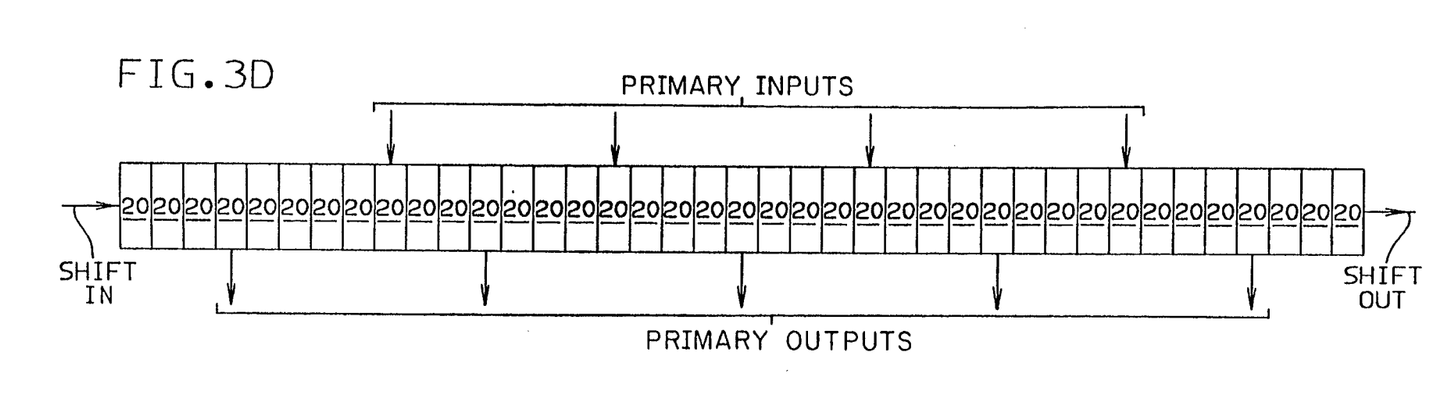
FIG. 3D illustrates yet another embodiment of the present invention.
Figure 3E:
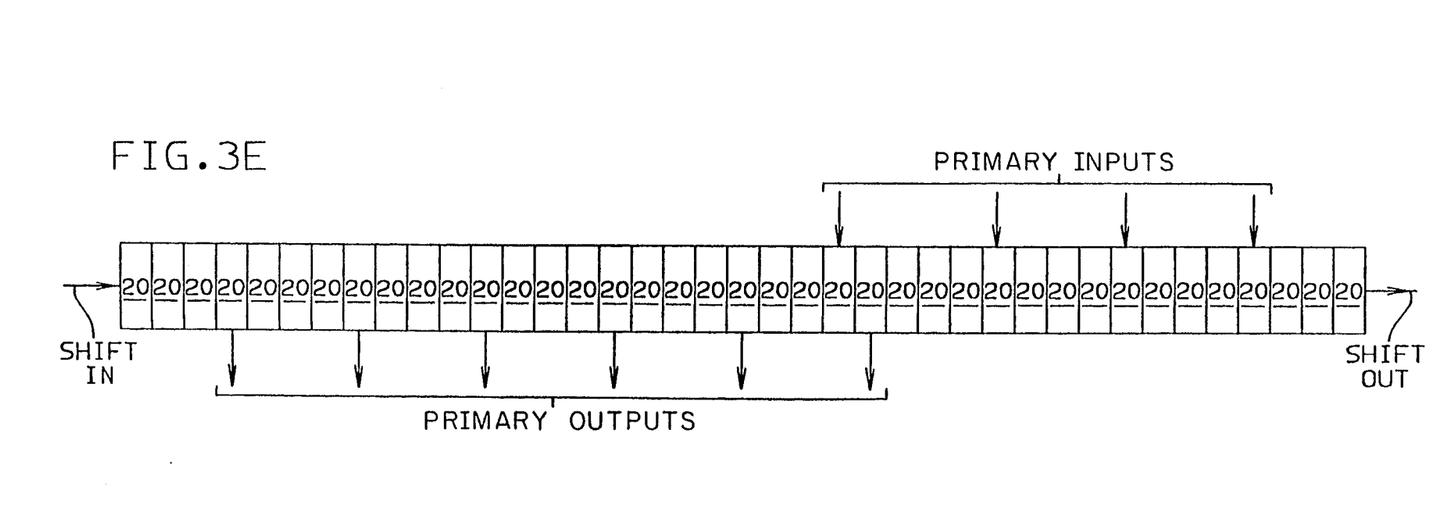
FIG. 3E is a functional block diagram illustrating another embodiment of the present invention.

An alternative embodiment is also shown in FIG. 3D indicating the principle that the SHIFT IN signal line can in fact operate as a supplier of scan ring fault isolation bits for latches located in the very first part of the scan string. Yet another distributed embodiment is illustrated in FIG. 3E where, as in FIG. 3D at least some test signals for the primary output signal lines are supplied more immediately from the SHIFT IN signal line. Likewise, certain primary input signal lines (near the right end of the scan string as shown) are employable in conjunction with the SHIFT OUT signal line to determine fault isolation near the end of the shift register latch scan string. Note though that it is generally more desirable to have overlap of primary input and primary output signal lines (as shown in FIGS. 3C and 3D) so as to insure that intermediate latches are more easily fault testable.

As one can see, there are a number of ways to provide the desired uniform distribution of connections. There is however a preferred method of determining segment length, were a "segment" is defined as that portion of a SRL between primary input connections. In particular, it is desirable to partition the INTERNAL SRLs into $n+1$ groups or segments where n is the number of INPUT SRLs. This is not a physical partitioning, but rather one for design discussion. Distribute the n INPUT SRLs in each segment, except the first segment of the scan string. An INPUT SRL should be the first SRL in each segment. The OUTPUT SRLs are then distributed in the middle of each segment. Although this schema cannot always isolate faults down to a single SRL, the groups of possible fault candidates are, on the average, a minimum.

If the term "subsegment" is defined as being that portion of an SRL between either primary input and/or primary output connections, and if there are n INPUT SRLs and m OUTPUT SRLs, then the number of subsegments in a scan string is then $n+m+1$. The average subsegment length will then be $$L_{av} = \frac{S}{n+m+1}$$

where S is the number of SRLs in the scan string. $L_{av}$ can be expressed as an integer Q plus a remainder R as a result of the integer division by $n+m+1$ as follows $$L_{av} = Q + \frac{R}{n+m+1}$$

As a result, there is thus seen to be R subsegments with $Q+1$ SRLs in each with each of the remaining $(n+m+1)-R$ subsegments having Q SRLs.

For the situation shown in FIG. 3A, an optional design in accordance with these principles, has $n=3$, $m=6$ and $S=39$. Thus the average subsegment length is $39/(3+6+1)=39/10=3+(9/10)$ so that $Q=3$ and $R=9$. Thus there would be 9 subsegments of length $Q+1=4$ and $(n+m+1)-R=10-9=1$ subsegment of length $Q=3$.

For the sake of comparison, it is noted that it is also possible to define a weighted average subsegment length $L_{wav}$ for random subsegments in the scan string. In the example that is actually shown in FIG. 3A (in contrast to the designed for case discussed above), it is seen that there are subsegments with the following lengths (considered from left to right): 6, 1, 1, 20, 1, 2, 1, 2, 1, 4 for a total of 39 SRLs. A weighted average may be computed as follows when due "weight" is given to the number of SRLs in the subsegment.

| SRLs in subsegment | Subsegment length | Product |
|---|---|---|
| 5 | 1 | 5 |
| 4 | 2 | 8 |
| 4 | 4 | 16 |
| 6 | 6 | 36 |
| 20 | 20 | 400 |
| | | $465 \div 39 = 11.92 = L_{wav}$ |

It is thus seen that the weighted average length in a design which is not in accord with the present invention is significantly greater than the average subsegment length of 3.9 as computed above for the same situation.

In terms of tracking down faulty latches, a procedure such as that now described may be employed. In particular, to test if a particular latch is faulty, one traces the path back from a subsequent primary output pin to find a primary input signal line, or if necessary the SHIFT IN line. This input latch is set to a signal value which is a value opposite to the value of the stuck fault. That is, if the latch is stuck at "one" a "zero" is set into the primary input latch. The reverse is true in case of a stuck at "zero" fault. In the case of a stuck at "zero" fault or if a "one" has been set into a primary input latch, all of the data scanned out of a subsequent primary output latch are "zeroes". If the scanned out data is the same as the expected values, the shift register latches downstream (in the signal path sense) of this input shift register latch are good. Otherwise, the group of SRLs which contain the faulty SRL has been isolated and no more back tracing along the scan string is necessary. These steps may be repeated until either a faulty shift register latch is located in a group, or no more input shift register latches can be found in the string.

The present invention also has implications if more than one chip design technology is employed. In the event that there is more than one type of technology employed on a chip, latches of one type of technology are preferably grouped together into a single group. In the event that one technology group of latches has no input latch, one may also implant latches which belong to another technology group. Connecting different technology shift register latches however usually requires a converter. A converter requires extra chip area and power to drive it. However, this method can be used if the converter presence creates no problems in logic block placements or power requirements. If using such extra converters becomes a problem, then the group of shift register latches which has no primary input latches should be placed closer to a primary input.

In those situations in which primary input connections exist upstream (in the data flow sense) of the primary output connections, and even generally, it is desirable to employ a mechanism for testing the scan path without having to scan in a whole string of test data. It is noted that by providing a mechanism for alternately setting "zero" and "one" values into the scan latches it is possible to achieve this objective. This method has an advantage of speed in that the delay associated with reading data into the scan string is eliminated. Instead, mechanisms are employed for setting and resetting the latches in an alternate fashion ( . . . 5 1 0 1 0 1 0 1 0 . . . ) as described above and as also shown in FIGS. 4A and 4B. In each of these figures a mechanism is shown for setting adjacent latches into logically opposite states. Thus, the expected output is a string of zeroes and ones or ones and zeroes alternating accordingly. If there is any deviation from this output, it is then known that one of the latches is experiencing a fault.

Figure 4A:
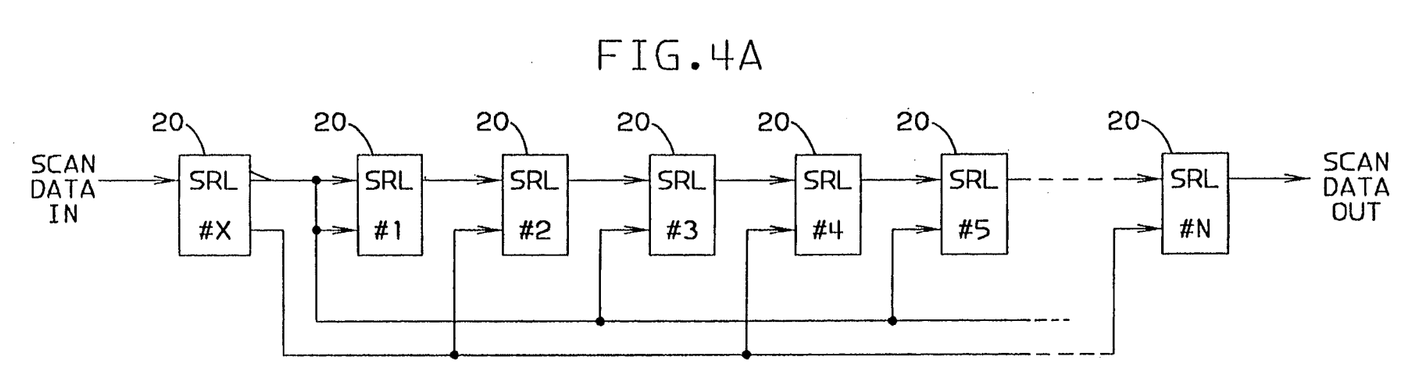
FIG. 4A illustrates a mechanism for loading a shift register scan string with alternate one and zero entries for the purpose of effecting fault isolation tests.

In particular, in FIG. 4A latch, SRL X, is used to set the other latches in the string alternately to ones and zeroes. In this embodiment on the first scan, latch SRL X is set to a "one" via the normal scan path thru upper terminal 1 of each SRL. The contents of SRL X are then propagated via a hardware Data Reset Control line (not shown) to SRL 2, 4, 6, etc. as ones and to SRL 1, 3, 5, etc. as zeroes via the reset data input (lower terminal 2) of each SRL. This data is then scanned out of the string to observe any abnormal sequence of data. For a second scan, the latch SRL X is set to a zero via the normal scan path. The contents of SRL X are then propagated via a hardware Data Reset Control line to SRL 2, 4, 6, etc. as zeroes and to SRL 1, 3, 5, etc. as ones. This data, complementary to the first set of scan data, is then scanned out of the string to observe any abnormal sequence of data. The faulty SRL (X or 1, . . . , N) ;can then be determinatively identified.

Figure 4B:
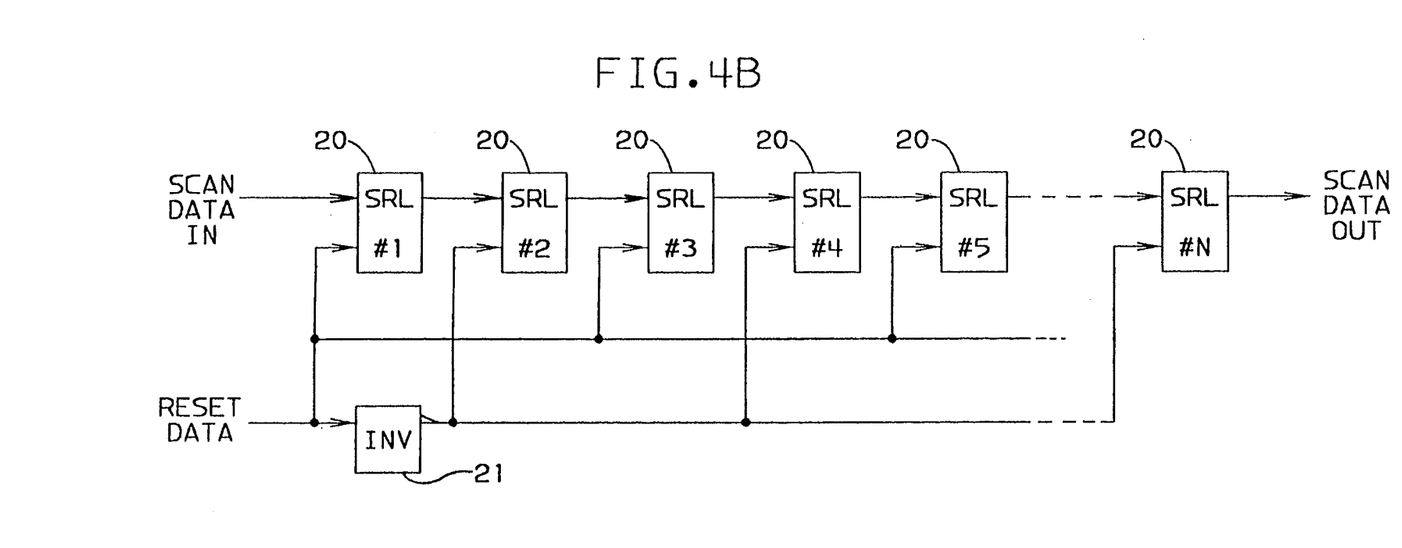
FIG. 4B illustrates an alternate mechanism for loading a scan string with alternating ones and zeroes, also for the purpose of diagnosing the operation of the scan string.

An alternate embodiment for quickly setting alternate latches is illustrated in FIG. 4B wherein a separate RESET DATA line is shown as supplying a reset signal to inverter 21. The output of inverter 21 is used to control the state of every even numbered shift register latch. The input to the inverter is used to control the state of the odd numbered latches. In this way, alternate ones and zeroes are set into the shift register latch string. Faulty latches are identified as described above.

From the above, it should be appreciated that by providing a more uniformly distributed set of either primary input or primary output signal line connections, it is easier to detect faults in an LSSD scan string. An alternative would be to employ a larger number of smaller scan strings but such solutions require more input and output test lines to the chip or system. Additionally, it is seen that the use of special reset circuits as shown in FIGS. 4A and 4B can avoid problems associated with random patterns being present during system start up. Thus an assist is given in the generation of certain fixed test data patterns.

Most importantly though, is seen that the connection distribution in the present invention facilitates physical failure analysis and provides significant feedback in system design. The use of the present invention is particularly desirable in critical portions of a new machine or in a system structure which is critical to its operation. Criticality increases the need for verifying the proper operation of test circuitry. The present invention also plays a significant role in the early development of computer chips and systems by means of its physical failure identification and analysis capabilities. Accordingly, it is seen that the present invention fills all of the objects stated above.

While the invention has been described in detail herein in accordance with certain preferred embodiments thereof, many modifications and changes therein may be effected by those skilled in the art. Accordingly, it is intended by the appended claims to cover all such modifications and changes as fall within the true spirit and scope of the invention.

The invention claimed is:

1. A logic circuit having a testable scan string, said circuit comprising:
    at least two combinatorial logic circuit blocks, one having a set of primary input signal lines and another block having a set of primary output signal lines;
    a set of shift register latches, some of whose inputs are connected to said primary input signal lines and some of whose outputs are connected as said primary output signal lines, said latches being electrically configurable to operate either as a single shift register, or as individual latches for (a) receiving said primary input signals lines or (b) for supplying said primary output signal lines or (c) as intermediate latches for output and input between said logic circuit blocks, wherein the primary input signal line connections and the primary output signal line connections are distributed along said single shift register wherein at least some of said latches are connected to non-adjacent ones of said latches in said single shift register, and wherein at least one of said primary input signal lines and at least one of said primary output signal lines are logically connected only through said single shift register, and wherein said at least one primary input signal line is connected to said single shift register at a location from which said at least one primary input signal line can affect said at least one primary output signal line.

2. The logic circuit of claim 1 in which the primary output signal line connections and the primary input signal line connections are distributed along said single shift register so that a plurality of said primary input signal lines can affect a plurality of said primary output signal lines only through said single shift register.

3. The logic circuit of claim 1 in which the primary input signal line connections are distributed only in a region of the single shift register adjacent to input portions of the single shift register.

4. The logic circuit of claim 1 in which the primary output signal line connections are distributed only in a region of the single shift register adjacent to output portions of the single shift register.

5. The logic circuit of claim 1 in which all of said primary input signal line connections are made to shift register latches nearer to the input end of said single shift register than any primary output signal line connection.

6. The logic circuit of claim 1 in which said primary input signal line connections and said primary output signal line connections are made so that either at least one primary input signal line is connected to a shift register latch that is disposed between other shift register latches that are connected to primary output signal lines, or at least one primary output signal line is connected to a shift register latch that is disposed between other shift register latches that are connected to primary input signal lines.

7. The logic circuit of claim 1 further including means for setting opposed logic states in adjacent ones of said shift register latches.

* * * * *